(12) United States Patent
Nanataki et al.

(10) Patent No.: US 7,545,084 B2
(45) Date of Patent: Jun. 9, 2009

(54) PIEZOELECTRIC/ELECTROSTRICTIVE CERAMIC COMPOSITION, PIEZOELECTRIC/ELECTROSTRICTIVE DEVICE, AND METHOD OF PRODUCING THE SAME

(75) Inventors: Tsutomu Nanataki, Nagoya (JP); Nobuyuki Kobayashi, Nagoya (JP); Koichi Yoshino, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1 day.

(21) Appl. No.: 11/778,837

(22) Filed: Jul. 17, 2007

(65) Prior Publication Data

US 2008/0018207 A1 Jan. 24, 2008

(30) Foreign Application Priority Data

Jul. 20, 2006 (JP) ............................. 2006-198255
May 31, 2007 (JP) ............................. 2007-144412

(51) Int. Cl.
*H01L 41/187* (2006.01)
(52) U.S. Cl. ............................ 310/358; 252/62.9 PZ; 501/134
(58) Field of Classification Search ................ 310/358; 501/134; 252/62.9 R, 62.9 PZ; 257/347
See application file for complete search history.

(56) References Cited

U.S. PATENT DOCUMENTS

| | | | |
|---|---|---|---|
| 4,670,815 A * | 6/1987 | Alexander et al. | 501/136 |
| 6,565,997 B2 | 5/2003 | Kashiwaya | |
| 6,610,427 B2 | 8/2003 | Kashiwaya et al. | |
| 6,652,905 B2 | 11/2003 | Kashiwaya | |
| 6,713,123 B2 | 3/2004 | Kashiwaya et al. | |
| 6,731,049 B2 | 5/2004 | Kashiwaya et al. | |
| 7,019,438 B2 * | 3/2006 | Takahashi et al. | 310/324 |
| 7,019,441 B2 | 3/2006 | Kashiwaya | |
| 7,052,732 B2 | 5/2006 | Kashiwaya et al. | |
| 7,083,269 B2 * | 8/2006 | Murai | 347/68 |
| 7,443,080 B2 * | 10/2008 | Yoshioka et al. | 310/328 |
| 2006/0119221 A1 * | 6/2006 | Ikeda et al. | 310/332 |
| 2007/0164639 A1 * | 7/2007 | Ohmori et al. | 310/366 |
| 2007/0222340 A1 * | 9/2007 | Sakamoto et al. | 310/358 |
| 2008/0129156 A1 * | 6/2008 | Kobayashi et al. | 310/366 |
| 2008/0213575 A1 * | 9/2008 | Shimizu et al. | 428/332 |

FOREIGN PATENT DOCUMENTS

| | | |
|---|---|---|
| JP | 44-017103 B | 7/1969 |
| JP | 45-008145 B | 3/1970 |
| JP | 2002-100819 A1 | 4/2002 |

* cited by examiner

*Primary Examiner*—Jaydi SanMartin
(74) *Attorney, Agent, or Firm*—Burr & Brown

(57) ABSTRACT

A piezoelectric/electrostrictive ceramic composition includes a $Pb(Mg_{1/3}Nb_{2/3})O_3$—$PbTiO_3$—$PbZrO_3$ ternary solid solution system composition as the major component, and further contains 0.05 to 3.0 mass % of Ni (in terms of NiO) and 0.01 to 1.0 mass % of Ag (in terms of AgO). The piezoelectric/electrostrictive ceramic composition can be used to form a piezoelectric/electrostrictive portion having excellent mechanical strength, and excellent piezoelectric/electrostrictive characteristics as well with seldom dielectric breakdown even under an application of a high electric field, at a relatively low firing temperature.

13 Claims, 4 Drawing Sheets

PIEZOELECTRIC/ELECTROSTRICTIVE CERAMIC COMPOSITION, PIEZOELECTRIC/ELECTROSTRICTIVE DEVICE, AND METHOD OF PRODUCING THE SAME

BACKGROUND OF THE INVENTION

1. Field of the Invention

The present invention relates to a piezoelectric/electrostrictive ceramic composition capable of forming a piezoelectric/electrostrictive portion which exhibits excellent mechanical strength, rarely exhibits a dielectric breakdown even when a high electric field is applied, and exhibits excellent piezoelectric/electrostrictive characteristics, a piezoelectric/electrostrictive device including a piezoelectric/electrostrictive portion obtained using the piezoelectric/electrostrictive ceramic composition, and a method of producing a piezoelectric/electrostrictive device.

2. Description of Related Art

A piezoelectric/electrostrictive device has been known as a device of which the displacement can be controlled with an accuracy of submicrometers. Such a piezoelectric/electrostrictive device is used in various applications such as a piezoelectric pressure sensor, a probe moving mechanism of a scanning type tunnel microscope, a rectilinear guide mechanism in an ultraprecise processing apparatus, a hydraulic control servo valve, a head of a VTR apparatus, pixels of a flat-panel image display apparatus, an injector for a diesel engine, and a head of an inkjet printer.

A multilayer piezoelectric/electrostrictive device obtained by alternately stacking a sheet-formed piezoelectric/electrostrictive ceramic composition and an electrode is suitable for obtaining a large displacement and a high output. However, since a large internal stress occurs in the multilayer device due to a large displacement, microcracks are likely to occur. Therefore, the mechanical strength and the dielectric breakdown strength of the piezoelectric/electrostrictive device must be improved for sufficient driving durability. Particularly, piezoelectric/electrostrictive devices employed in new applications such as a high-viscosity liquid discharge device and a diesel engine injector is required to exhibit an extremely large displacement. However, when the piezoelectric/electrostrictive device is driven with a large displacement, microcracks easily occur in the piezoelectric/electrostrictive portion. Therefore, in order to ensure excellent driving durability under conditions in which a large displacement is required, the piezoelectric/electrostrictive portion must have a higher dielectric breakdown strength.

Various studies have also been conducted on a piezoelectric/electrostrictive ceramic composition which forms a piezoelectric/electrostrictive material. For example, a $Pb(Mg_{1/3}Nb_{2/3})O_3$—$PbTiO_3$—$PbZrO_3$ ternary solid solution system composition (hereinafter also called "PMN-PZT composition") or a piezoelectric/electrostrictive ceramic composition obtained by replacing Pb in the composition with Sr, La, or the like has been disclosed (see JP-B-4417103 and JP-B-45-8145, for example). With such a composition, it is expected that a piezoelectric/electrostrictive device would be obtained in which a piezoelectric/electrostrictive material, which determines the piezoelectric/electrostrictive characteristics of the piezoelectric/electrostrictive device and therefore is the most important component, exhibits excellent piezoelectric/electrostrictive characteristics (piezoelectric constant d, for example).

In order to improve the piezoelectric characteristics by further increasing the density of piezoelectric/electrostrictive material, there is disclosed a piezoelectric device including a piezoelectric material formed of a ceramic composition in which 0.05 to 10 wt % of NiO is added to the PMN-PZT ceramic composition (see JP-A-2002-100819, for example), However, although increased to some extent, the density of the piezoelectric material of the piezoelectric device disclosed in JP-A-2002-100819 is still insufficient, and thus, the dielectric breakdown strength is insufficient. Therefore, a dielectric breakdown easily occurs when a high electric field is applied.

SUMMARY OF THE INVENTION

The present invention has been made in view of the above problems of the related art, and has an object of providing a piezoelectric/electrostrictive ceramic composition capable of forming a piezoelectric/electrostrictive portion, of which a dielectric breakdown rarely occurs even when a high electric field is applied and which has excellent piezoelectric/electrostrictive characteristics, at a relatively low firing temperature. The present invention has another object of providing a piezoelectric/electrostrictive device including a piezoelectric/electrostrictive portion of which a dielectric breakdown rarely occurs even when a high electric field is applied and which has excellent piezoelectric/electrostrictive characteristics, and a method of producing the same.

The inventors of the present invention have conducted extensive studies in order to achieve the above objects. As a result, the inventors have found that the above objects can be achieved by a composition containing a $Pb(Mg_{1/3}Nb_{2/3})O_3$—$PbTiO_3$—$PbZrO_3$ ternary solid solution system composition as the major component and specific amounts of Ni and Ag. Thus, the present invention has been completed.

Specifically, the present invention provides the following piezoelectric/electrostrictive ceramic composition, a method of producing the same, a piezoelectric/electrostrictive device, and a method of producing the same.

[1] A piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni (in terms of NiO) and 0.01 to 1.0 mass % of Ag (in terms of AgO).

[2] The piezoelectric/electrostrictive ceramic composition according to [1], wherein the $Pb(Mg_{1/3}Nb_{2/3})O_3$—$PbTiO_3$—$PbZrO_3$ ternary solid solution system composition is shown by the following formula (1), $$Pb_x(Mg_{y/3}Nb_{2/3})_aTi_bZr_cO_3 \quad (1)$$

wherein $0.95 \leq x \leq 1.05$, $0.8 \leq y \leq 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in coordinate system having a, b, and c coordinate axes (provided that (a+b+c)=1.000).

[3] A piezoelectric/electrostrictive device comprising:
  a piezoelectric/electrostrictive portion formed of a piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni (in terms of NiO) and 0.01 to 1.0 mass % of Ag (in terms of AgO); and
  an internal electrode electrically connected with the piezoelectric/electrostrictive portion.

[4] The piezoelectric/electrostrictive device according to [3]: wherein the $Pb(Mg_{1/3}Nb_{2/3})O_3$—$PbTiO_3$—$PbZrO_3$ ternary solid solution system composition is shown by the following formula (1), $$Pb_x(Mg_{y/3}Nb_{2/3})_aTi_bZr_cO_3 \qquad (1)$$

wherein $0.95 \leq x \leq 1.05$, $0.8 \leq y \leq 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in coordinate system having a, b, and c coordinate axes (provided that (a+b+c)=1.000).

[5] The piezoelectric/electrostrictive device according to [3] or [4], further comprising:
a substrate formed of a ceramic;
wherein the piezoelectric/electrostrictive portion is solidly attached on the substrate directly or with the internal electrode placed therebetween.

[6] The piezoelectric/electrostrictive device according to any one of [3] to [5], comprising:
a plurality of the piezoelectric/electrostrictive portions and a plurality of the internal electrodes;
wherein the piezoelectric/electrostrictive portions are stacked alternately by sandwiching a single or plural number of piezoelectric/electrostrictive portions between the internal electrodes.

[7] The piezoelectric/electrostrictive device according to any one of [3] to [6], comprising:
a plurality of the piezoelectric/electrostrictive portions and a plurality of the internal electrodes;
wherein the piezoelectric/electrostrictive portions are sandwiched between the internal electrodes in units of one or more piezoelectric/electrostrictive portions.

[8] The piezoelectric/electrostrictive device according to any one of [3] to [7], wherein the internal electrode is an Ag electrode or an Ag—Pd electrode.

[9] The piezoelectric/electrostrictive device according to any one of [3] to [8], further comprising an external electrode connected with every other internal electrode.

[10] A method of producing a piezoelectric/electrostrictive device including a piezoelectric/electrostrictive portion and an internal electrode electrically connected with the piezoelectric/electrostrictive portion, the method comprising:
forming a piezoelectric/electrostrictive portion by firing, at a temperature of 950° C. or higher but lower than 1100° C., an unfired piezoelectric/electrostrictive portion having a prescribed form and being made of a piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni (in terms of NiO) and 0.01 to 1.0 mass % of Ag (in terms of AgO).

[11] The method of producing a piezoelectric/electrostrictive device according to [10], wherein the $Pb(Mg_{1/3}Nb_{2/3})O_3$—$PbTiO_3$—$PbZrO_3$ ternary solid solution system composition is shown by the following formula (1), $$Pb_x(Mg_{y/3}Nb_{2/3})_aTi_bZr_cO_3 \qquad (1)$$

wherein $0.95 \leq x \leq 1.05$, $0.8 \leq y \leq 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in coordinate system having a, b, and c coordinate axes (provided that (a+b+c)=1.000).

[12] The method of producing a piezoelectric/electrostrictive device according to [10] or [11], wherein the unfired piezoelectric/electrostrictive portion is fired under such a state that the portion is contacted with the internal electrode, which is an Ag electrode or an Ag—Pd electrode.

[13] The method of producing a piezoelectric/electrostrictive device according to any one of [10] to [12], wherein a Pb source is added to the unfired piezoelectric/electrostrictive portion in an amount of 0.01 to 2.0 parts by mass, in terms of PbO, based on 100 parts by mass of the $Pb(Mg_{1/3}Nb_{2/3})O_3$—$PbTiO_3$—$PbZrO_3$ ternary solid solution system composition.

[14] The method of producing a piezoelectric/electrostrictive device according to any one of [10] to [13], wherein the unfired piezoelectric/electrostrictive portion disposed on a ceramic substrate directly or with the internal electrode placed therebetween is fired to attach solidly the piezoelectric/electrostrictive portion to the substrate directly or with the internal electrode placed therebetween.

[15] The method of producing a piezoelectric/electrostrictive device according any one of [10] to [14],
wherein the unfired piezoelectric/electrostrictive portion having a prescribed form is a green sheet containing the piezoelectric/electrostrictive ceramic composition; and
wherein a plurality of green sheets with an internal electrode obtained by forming an internal electrode on the green sheet are stacked and then fired.

[16] A method of producing a piezoelectric/electrostrictive device including a piezoelectric/electrostrictive portion formed of a piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni (in terms of NiO) and 0.01 to 1.0 mass % of Ag (in terms of AgO); and an internal electrode electrically connected with the piezoelectric/electrostrictive portion, which is an Ag electrode or an Ag—Pd electrode, the method comprising:
forming a piezoelectric/electrostrictive device by firing, at a temperature of 950° C. or higher but lower than 1100° C., an unfired piezoelectric/electrostrictive portion having a prescribed form and being made of a piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni (in terms of NiO), and an fired internal electrode being made of an Ag electrode or an Ag—Pd electrode.

[17] The method of producing a piezoelectric/electrostrictive device according to [16], wherein the $Pb(Mg_{1/3}Nb_{2/3})O_3$—$PbTiO_3$—$PbZrO_3$ ternary solid solution system composition is shown by the following formula (1), $$Pb_x(Mg_{y/3}Nb_{2/3})_aTi_bZr_cO_3 \qquad (1)$$

wherein $0.95 \leq x \leq 1.05$, $0.8 \leq y \leq 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in coordinate system having a, b, and c coordinate axes (provided that (a+b+c)=1.000).

[18] The method of producing a piezoelectric/electrostrictive device according to [16] or [17], wherein a Pb source is added to the unfired piezoelectric/electrostrictive portion in an amount of 0.01 to 2.0 parts by mass, in terms of PbO, based on 100 parts by mass of the Pb(Mg$_{1/3}$Nb$_{2/3}$)O$_3$—PbTiO$_3$—PbZrO$_3$ ternary solid solution system composition.

[19] The method of producing a piezoelectric/electrostrictive device according to any one of [16] to [18], wherein the unfired piezoelectric/electrostrictive portion disposed on a ceramic substrate directly or with the internal electrode placed therebetween is fired to attach solidly the piezoelectric/electrostrictive portion to the substrate directly or with the internal electrode placed therebetween.

[20] The method of producing a piezoelectric/electrostrictive device according to any one of [16] to [19],
wherein the unfired piezoelectric/electrostrictive portion having a prescribed form is a green sheet containing the piezoelectric/electrostrictive ceramic composition; and
wherein a plurality of green sheets with an internal electrode obtained by forming an internal electrode on the green sheet are stacked and then fired.

According to the present invention, a piezoelectric/electrostrictive ceramic composition is provided which is capable of forming a piezoelectric/electrostrictive portion which exhibits excellent mechanical strength, rarely exhibits a dielectric breakdown even when a high electric field is applied, and exhibits excellent piezoelectric/electrostrictive characteristics, at a relatively low firing temperature According to the present invention, a piezoelectric/electrostrictive device is provided having a piezoelectric/electrostrictive portion which exhibits excellent mechanical strength, rarely exhibits a dielectric breakdown even when a high electric field is applied, and exhibits excellent piezoelectric/electrostrictive characteristics.

According to the first and second methods of producing a piezoelectric/electrostrictive device of the present invention, a piezoelectric/electrostrictive device can be produced which includes a piezoelectric/electrostrictive portion which rarely exhibits a dielectric breakdown even when a high electric field is applied and has excellent piezoelectric/electrostrictive characteristics. Note that the expression "the present method of producing a piezoelectric/electrostrictive device of the present invention" is often used in the present specification to refer to both the first method and second method of producing a piezoelectric/electrostrictive device of the present invention or the embodiments according to the present invention.

Figure 1:
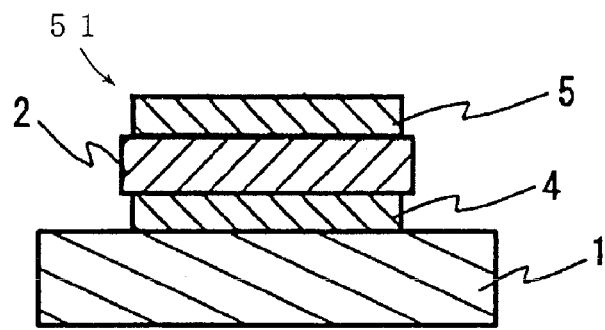
FIG. 1 is a cross-sectional view schematically showing one embodiment of a piezoelectric/electrostrictive device according to the present invention.

The numerical references used in the accompanying Figures denote a portion or member as specified below: 1a . . . attaching surface, 1b . . . thick portion, 1c . . . thin portion, 1 . . . substrate, 2, 3 . . . piezoelectric/electrostrictive portion, 4, 5, 6 . . . internal electrode, 10 . . . piezoelectric/electrostrictive unit, 12 . . . first piezoelectric/electrostrictive portion, 13 . . . second piezoelectric/electrostrictive portion, 20 . . . common substrate, 32 . . . piezoelectric/electrostrictive layer, 34, 35 . . . internal electrode layer, 51, 61 . . . piezoelectric/electrostrictive device.

DETAILED DESCRIPTION OF THE INVENTION AND PREFERRED EMBODIMENTS

Preferred embodiments of the present invention are described below Note that the present invention is not limited thereto. Various modifications and improvements may be made without departing from the scope of the present invention based on the knowledge of a person skilled in the art.

1. Piezoelectric/Electrostrictive Ceramic Composition

A piezoelectric/electrostrictive ceramic composition according to one embodiment of the present invention includes a Pb(Mg$_{1/3}$Nb$_{2/3}$)O$_3$—PbTiO$_3$—PbZrO$_3$ ternary solid solution system composition as the major component, Ni, and Ag, and has an Ni content (in terms of NiO) of 0.05 to 3.0 mass %, and an Ag content (in terms of AgO) of 0.01 to 1.0 mass %. The details are described below.

The piezoelectric/electrostrictive ceramic composition according to the present invention includes the Pb(Mg$_{1/3}$Nb$_{2/3}$)O$_3$—PbTiO$_3$—PbZrO$_3$ ternary solid solution system composition as the major component, Ni, and Ag, and has a specific Ni content and a specific Ag content (in terms of AgO). It is preferable that the piezoelectric/electrostrictive ceramic composition according to the present invention be substantially formed of the Pb(Mg$_{1/3}$Nb$_{2/3}$)O$_3$—PbTiO$_3$—PbZrO$_3$ ternary solid solution system composition as the major component, Ni, and Ag. Since the piezoelectric/electrostrictive ceramic composition according to the present invention includes the PMN-PZT composition as the major component and contains Ni and Ag in specific amounts, a dielectric breakdown rarely occurs even when a high electric field is applied.

The piezoelectric/electrostrictive ceramic composition according to the present invention includes the PMN-PZT composition as the major component. The expression "the piezoelectric/electrostrictive ceramic composition includes the PMN-PZT composition Pb(Mg$_{1/3}$Nb$_{2/3}$)O$_3$—PbTiO$_3$—PbZrO$_3$ ternary solid solution system composition) as the major component" means that the content of the PMN-PZT composition is 95 mass % or more, and preferably 98 mass % or more of the piezoelectric/electrostrictive ceramic composition excluding Ni and Ag.

The piezoelectric/electrostrictive ceramic composition according to the present invention includes Ni (in terms of NiO) in an amount of 0.05 to 3.0 mass %, preferably 0.1 to 2.5 mass %, and more preferably 0.15 to 1.5 mass %. By adjusting the Ni content in this range, a piezoelectric/electrostrictive portion with improved piezoelectric/electrostrictive characteristics (strain characteristics) can be formed of which a dielectric breakdown rarely occurs even when a high electric field is applied.

The piezoelectric/electrostrictive ceramic composition according to the present invention includes Ag (in terms of AgO) in an amount of 0.01 to 1.0 mass %, preferably 0.05 to 0.8 mass %, and more preferably 0.1 to 0.4 mass %. By adjusting the Ag content (in terms of AgO) in this range, a piezoelectric/electrostrictive portion with improved piezoelectric/electrostrictive characteristics can be formed of which a dielectric breakdown rarely occurs even when a high electric field is applied.

The Ni content (in terms of NiO) and Ag content (in terms of AgO) in this specification are measured by an ICP method, a fluorescent X-ray method, and an EPMA method. More specifically, the NiO content and the Ag content (in terms of AgO) of the standard substance are measured using the ICP method or the fluorescent X-ray method to create calibration curves. Then, a sample is subjected to measurement by the EPMA method to calculate the NiO content (in terms of NiO) and the Ag content (in terms of AgO) based on the created calibration curves.

The composition shown by the following formula (1) is preferable as the PMN-PZT composition included in the piezoelectric/electrostrictive ceramic composition according to the present invention in that a piezoelectric/electrostrictive material (piezoelectric/electrostrictive portion) having higher piezoelectric characteristics can be formed.

$$Pb_x(Mg_{y/3}Nb_{2/3})_a Ti_b Zr_c O_3 \quad (1)$$

wherein $0.95 \leq x < 1.05$, $0.8 < y < 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in a coordinate system having a, b, and c coordinate axes (provided that (a+b+c)=1.000).

The microstructure of the piezoelectric/electrostrictive ceramic composition according to the present invention may have various forms. Examples of the forms of the portion where Ag exists include structures in which (1) a number of crystal grains are formed, and AgO exists within the crystal grains, (2) a number of crystal grains are formed, and at least one of Ag (metallic) and AgO exists between the adjacent crystal grains (at grain boundaries), and (3) a combination of (1) and (2), and the like.

Examples of the forms of the portion where Ni exists include structures in which (1) a number of crystal grains are formed, and NiO exists within the crystal grains, (2) a number of crystal grains are formed, and at least one of Ni (metallic) and NiO exists between the adjacent crystal grains (at grain boundaries), and (3) a combination of (1) and (2), and the like.

In the case where Pb is added, examples of the forms of the portion where Pb exists include structures in which (1) a number of crystal grains are formed, and PbO exists within the crystal grains, (2) a number of crystal grains are formed, and at least one of Pb (metallic) and PbO exists between the adjacent crystal grains (at grain boundaries); and (3) a combination of (1) and (2), and the like. If the locations (distribution) of Ag(metallic), AgO, Ni (metallic), NiO, Pb (metallic), and PbO are measured by EPMA in the region, which contains a number of crystal grains and grain boundaries forming the piezoelectric/electrostrictive composition of the present invention, the elements and oxides thereof are usually distributed uniformly within the measurement region.

2. Method of Producing Piezoelectric/Electrostrictive Ceramic Composition

Next, a method of producing the piezoelectric/electrostrictive ceramic composition according to the present invention will be described. When producing the piezoelectric/electrostrictive ceramic composition according to the present invention, raw material compounds, each containing the element that constitutes the $Pb(Mg,Ni)_{1/3}Nb_{2/3}O_3$—$PbZrO_3$—$PbTiO_3$ ternary solid solution system composition, are mixed to form a mixed raw material. Specific examples of the raw material compounds include elements such as Pb, Mg, Nb, Zr, and Ti, an oxide thereof (PbO, $Pb_3O_4$, MgO, $Nb_2O_5$, $TiO_2$, $ZrO_2$, and the like), and carbonates ($MgCO_3$ and the like), and compounds containing two or more of these elements ($MgNb_2O_6$, $NiNb_2O_6$, and the like), and the like.

The raw material compounds may be mixed by a general method, such as by using a ball mill. Specifically, the various raw material compounds, balls, and water are placed in a ball mill device in specific amounts, and the ball mill device is rotated for a specific amount of time to prepare a mixed slurry. Next, the prepared mixed slurry is dried by a drier or through filtration or the like to obtain a mixed raw material.

The obtained mixed raw material is prefired at 750° C. to 1100° C. After the addition of appropriate amounts of an Ni source such as Ni (NiO), an Ag source such as Ag (AgO), and, if desired, a Pb source such as Pb (PbO), the components are mixed and fired at 950° C. or above, but below 1100° C., to obtain a piezoelectric/electrostrictive ceramic composition. In the resulting piezoelectric/electrostrictive ceramic composition, the ratio of the maximum intensity of the diffraction line of the pyrochlore phase to the maximum intensity of the diffraction line of the perovskite phase measured by using an X-ray diffraction device is preferably 5% or less, and more preferably 2% or less.

It is preferable to add Pb after prefiring and fire the resulting mixture, since a piezoelectric/electrostrictive material (piezoelectric/electrostrictive portion) can be formed of which a dielectric breakdown further rarely occurs even when a high electric field is applied. The amount of Pb to be added, in terms of PbO, is preferably 0.01 to 2.0 parts by mass, more preferably 0.1 to 1.5 parts by mass, and particularly preferably 0.5 to 1.0 part by mass based on 100 parts by mass of the PMN-PZT composition. By adjusting the added amount of Pb (in terms of PbO) in this range, the piezoelectric/electrostrictive characteristics of the resulting piezoelectric/electrostrictive material (piezoelectric/electrostrictive portion) is further improved.

The obtained piezoelectric/electrostrictive ceramic composition is ground as necessary to obtain a piezoelectric/electrostrictive ceramic composition with a desired particle size. The piezoelectric/electrostrictive ceramic composition may be ground by using a ball mill or the like. The average particle size of the piezoelectric/electrostrictive ceramic composition obtained by grinding is preferably 0.1 to 1.0 micrometer, and more preferably 0.2 to 0.7 μm. The particle size may be adjusted by subjecting the powder of the piezoelectric/electrostrictive ceramic composition obtained by grinding to a heat treatment at 400° C. to 750° C. In this case, fine particles are aggregated with other particles to form a powder with a uniform particle size, whereby a piezoelectric/electrostrictive portion with a uniform particle size can be obtained. The piezoelectric/electrostrictive ceramic composition may be prepared using an alkoxide method or a coprecipitation method, for example.

3. Piezoelectric/Electrostrictive Device

Next, embodiments of a piezoelectric/electrostrictive device according to the present invention will be described in detail with reference to the drawings. FIG. 1 is a cross-sectional view schematically showing one embodiment of a piezoelectric/electrostrictive device according to the present invention. As shown in FIG. 1, a piezoelectric/electrostrictive device 51 according to this embodiment includes a substrate 1 formed of a ceramic, a film-formed piezoelectric/electrostrictive portion 2, and film-formed internal electrodes 4 and 5 electrically connected with the piezoelectric/electrostrictive portion 2, the piezoelectric/electrostrictive portion 2 being solidly attached to the substrate 1 with the internal electrode 4 placed therebetween. The piezoelectric/electrostrictive portion may be solidly attached directly to the substrate without the internal electrode. The term "solidly attached" used in this specification refers to a state in which the piezoelectric/electrostrictive portion 2 and the substrate 1 or the internal electrode 4 are tightly integrated by a solid phase reaction without the use of an organic or inorganic adhesive. The expression "prescribed form" used in this specification refers to a form designed according to the intended usage of the device, or a form which is deemed to be inherent to the device itself.

The piezoelectric/electrostrictive portion 2 of the piezoelectric/electrostrictive device 51 according to this embodiment is formed of the above piezoelectric/electrostrictive ceramic composition according to the present invention. That is, the piezoelectric/electrostrictive portion 2 of the piezoelectric/electrostrictive device 51 according to this embodiment is formed of the piezoelectric/electrostrictive ceramic composition containing specific amounts of the PMN-PZT composition, Ni, and Ag. Thus, the piezoelectric/electrostrictive device 51 according to this embodiment includes a piezoelectric/electrostrictive portion 2 which has excellent mechanical strength and of which a dielectric breakdown rarely occurs even when a high electric field is applied. The piezoelectric/electrostrictive portion 2 can be formed at a relatively low firing temperature. Therefore, an Ag—Pd electrode, which has a lower melting point than a Pt electrode, can be readily used as the internal electrode. The piezoelectric/electrostrictive portion 2 is also excellent in terms of material cost, energy cost, and versatility.

Figure 3:
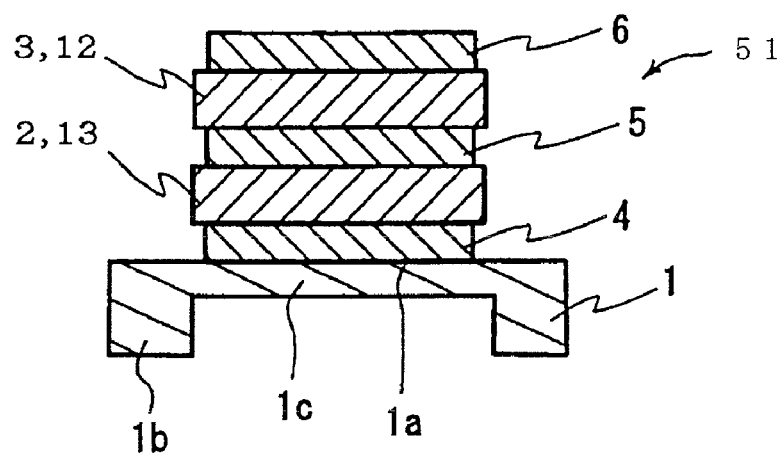
FIG. 3 is a cross-sectional view schematically showing still another embodiment of a piezoelectric/electrostrictive device according to the present invention.

As shown in FIG. 3, it is also preferable that the piezoelectric/electrostrictive device 51 according to this embodiment include piezoelectric/electrostrictive portions 2 and 3 and internal electrodes 4, 5, and 6, and that the piezoelectric/electrostrictive portions 2 and 3 be sandwiched between the internal electrodes 4, 5, and 6. This multilayer configuration is preferable because a large bending displacement can be obtained at low voltage. Two or more piezoelectric/electrostrictive portions may be sandwiched between two or more internal electrodes.

The thickness of the piezoelectric/electrostrictive portion 2 (see FIG. 1) is preferably 0.5 to 50 µm, more preferably 0.8 to 40 µm, and particularly preferably 1.0 to 30 µm. If the thickness of the piezoelectric/electrostrictive portion 2 is less than 0.5 µm, the density of the piezoelectric/electrostrictive portion formed of the piezoelectric/electrostrictive ceramic composition according to the present invention may be insufficient. If the thickness of the piezoelectric/electrostrictive portion 2 is greater than 50 µm, the shrinkage stress of the piezoelectric/electrostrictive composition during firing increases, whereby the substrate 1 must be made thicker in order to prevent breakage of the substrate 1. Thus, it may be difficult to reduce the size of the device. In the case where the piezoelectric/electrostrictive device 51 is a multilayer piezoelectric/electrostrictive device as shown in FIG. 3, the thicknesses of the piezoelectric/electrostrictive portions 2 and 3 refer to the thickness of each of the piezoelectric/electrostrictive portions 2 and 3.

The type of ceramic that forms the substrate is not particularly limited. The substrate is preferably formed of a ceramic which includes at least one material selected from the group consisting of stabilized zirconium oxide, aluminum oxide, magnesium oxide, mullite, aluminum nitride, silicon nitride, and glass from the viewpoint of heat resistance, chemical stability, and insulating characteristics. The stabilized zirconium oxide is particularly preferable in terms of excellent mechanical strength and toughness. The term "stabilized zirconium oxide" used herein refers to zirconium oxide of which the crystal phase transition is suppressed by the addition of a stabilizer, and includes partially stabilized zirconium oxide.

As the stabilized zirconium oxide, zirconium oxide containing a stabilizer such as calcium oxide, magnesium oxide, yttrium oxide, scandium oxide, ytterbium oxide, cerium oxide, or an oxide of a rare earth metal in an amount of 1 to 30 mol % can be given. Stabilized zirconium oxide containing yttrium oxide as the stabilizer is particularly preferable, since the mechanical strength of a vibration portion is particularly high. In this case, the amount of yttrium oxide contained in the stabilized zirconium oxide is preferably 1.5 to 6 mol %, and more preferably 2 to 4 mol %. It is preferable that the stabilized zirconium oxide further contain aluminum oxide in an amount of 0.1 to 5 mol %. The crystal phase of the stabilized zirconium oxide may be a mixed phase of a cubic crystal and a monoclinic crystal, a mixed phase of a tetragonal crystal and a monoclinic crystal, a mixed phase of a cubic crystal, a tetragonal crystal, and a monoclinic crystal, or the like. The main crystal phase of the stabilized zirconium oxide is preferably a tetragonal crystal or a mixed crystal of a tetragonal crystal and a cubic crystal from the viewpoint of strength, toughness, and durability.

The thickness of the substrate is preferably 1 micrometer to 1 mm, more preferably 1.5 to 500 µm, and particularly preferably 2 to 200 µm. If the thickness of the substrate is less than 1 micrometer, the mechanical strength of the piezoelectric/electrostrictive device may decrease. If the thickness exceeds 1 mm, the substrate becomes too rigid despite the shrinkage stress generated when voltage is applied to the piezoelectric/electrostrictive device, whereby the bending displacement of the piezoelectric/electrostrictive portion may decrease.

Figure 2:
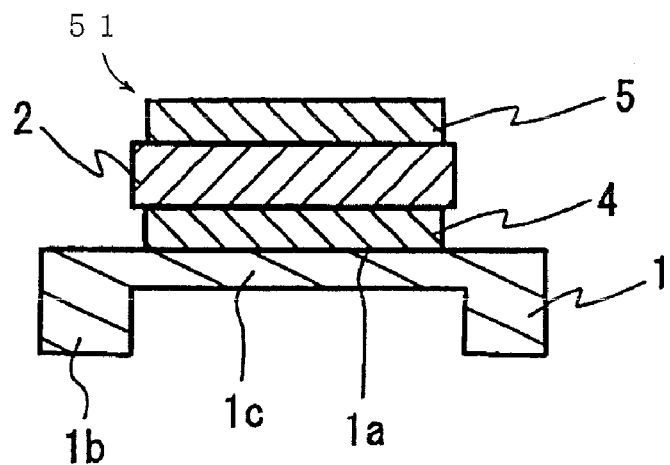
FIG. 2 is a cross-sectional view schematically showing another embodiment of a piezoelectric/electrostrictive device according to the present invention.
Figure 4:
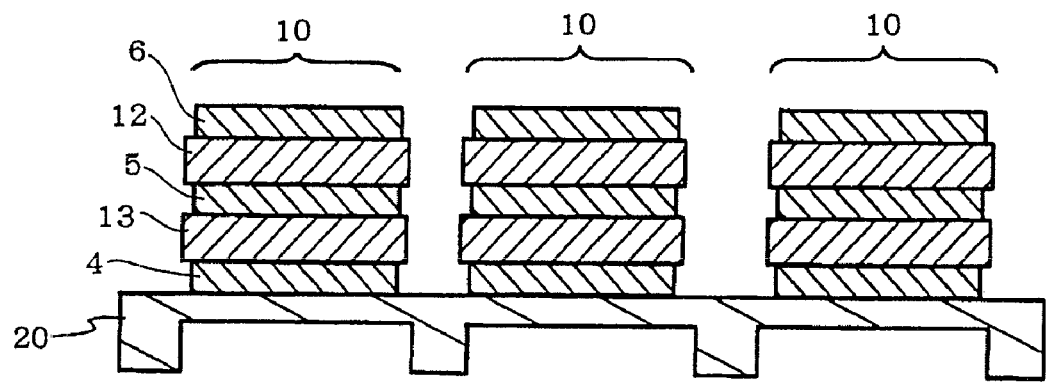
FIG. 4 is a cross-sectional view schematically showing still another embodiment of a piezoelectric/electrostrictive device according to the present invention.

FIG. 2 is a cross-sectional view schematically showing another embodiment of the piezoelectric/electrostrictive device according to the present invention. As shown in FIG. 2, the substrate 1 may be formed in such a form that the substrate 1 includes a thin portion 1c, which has a thickness in the range stated above and includes an attaching surface 1a, and thick portions 1b, which are located at a position other than that corresponding to the attaching surface 1a and have a thickness greater than that of the thin portion 1c. The internal electrode 4 (or the piezoelectric/electrostrictive portion) is arranged in a region approximately corresponding to the attaching surface 1a. With the substrate 1 having such a form, a piezoelectric/electrostrictive device can be formed which exhibits a sufficiently large bending displacement and a high mechanical strength. A common substrate 20 shown in FIG. 4, in which the substrate 1 shown in FIG. 2 are formed continuously, may be used to arrange a number of piezoelectric/electrostrictive device units 10 respectively including a first piezoelectric/electrostrictive portion 12, a second piezoelectric/electrostrictive portion 13, and internal electrodes 4, 5, and 6 on the common substrate 20.

There are no specific limitations to the surface form of the substrate (form of the surface to which the internal electrode 4 is solidly attached in FIG. 1). For example, the surface form of the substrate may be a rectangle, square, triangle, ellipse, circle, rounded square, rounded rectangle, or complex form formed of a combination thereof. There are no specific limitations to the form of the substrate as a whole. The substrate may have a capsule form with an appropriate internal space.

The internal electrode is electrically connected with the piezoelectric/electrostrictive portion, and is preferably disposed between the piezoelectric/electrostrictive portions if there are two or more piezoelectric/electrostrictive portions. The internal electrode is preferably arranged on the piezoelectric/electrostrictive portion in a region that substantially contributes to the bending displacement and the like. Specifically, as shown in FIG. 3, the internal electrodes 4, 5, and 6 are preferably arranged on the first piezoelectric/electrostrictive portion 12 or the second piezoelectric/electrostrictive portion 13 in a region including the central portion and having an area of 80% more of the first piezoelectric/electrostrictive portion 12 or the second piezoelectric/electrostrictive portion 13.

As the material for the internal electrode, at least one metal selected from the group consisting of Pt, Pd, Rh, Au, Ag, and alloys of these metals can be given. It is particularly preferable to use platinum or an alloy containing platinum as the major component in terms of high heat resistance when firing the piezoelectric/electrostrictive portion. Since the piezoelectric/electrostrictive portion can be formed at a lower firing temperature using the piezoelectric/electrostrictive ceramic composition according to the present invention, an alloy such as Ag—Pd can be suitably used as the material for the internal electrode. In the case where Ag or an alloy such as Ag—Pd is used as the material for the internal electrode, the Ag in the internal electrode may be partially moved to the piezoelectric/electrostrictive portion by firing or the like. In this case, a piezoelectric/electrostrictive portion with a desired Ag content (in terms of AgO) can be formed by appropriately adjusting the amount of an Ag source such as AgO which is added when producing the piezoelectric/electrostrictive ceramic composition.

The thickness of the internal electrode is preferably 15 μm or less, and more preferably 5 μm or less. If the thickness exceeds 15 μm, the internal electrode acts as a stress absorbing layer, whereby the bending displacement may decrease. The substantial functions of the internal electrode can be obtained if the thickness of the internal electrode is 0.05 μm or greater.

Figure 5A:
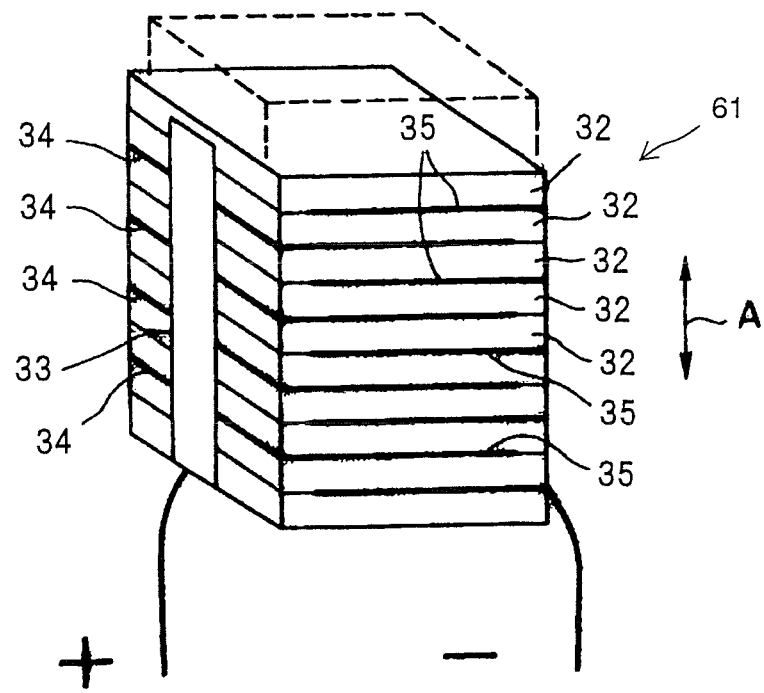
FIG. 5(a) is a perspective view schematically showing still another embodiment of a piezoelectric/electrostrictive device according to the present invention and FIG. 5(b) is a perspective view showing patterns of internal electrodes of the piezoelectric/electrostrictive device shown in FIG. 5(a).
Figure 5B:
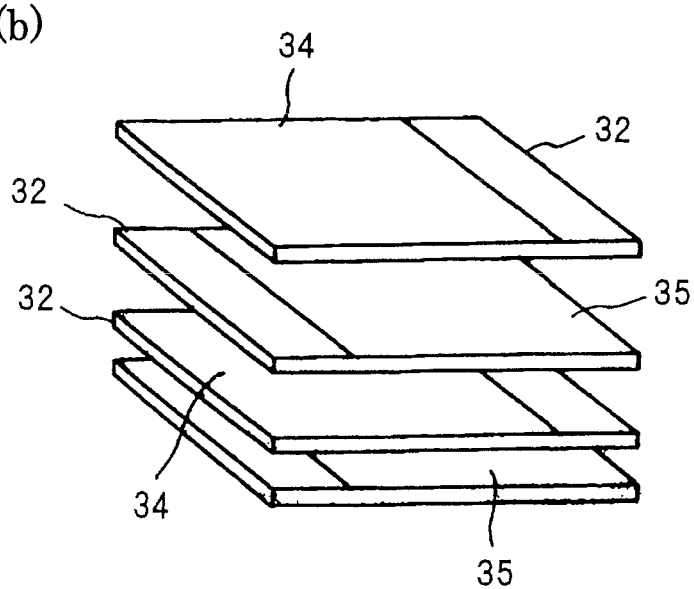
Figure 6A:
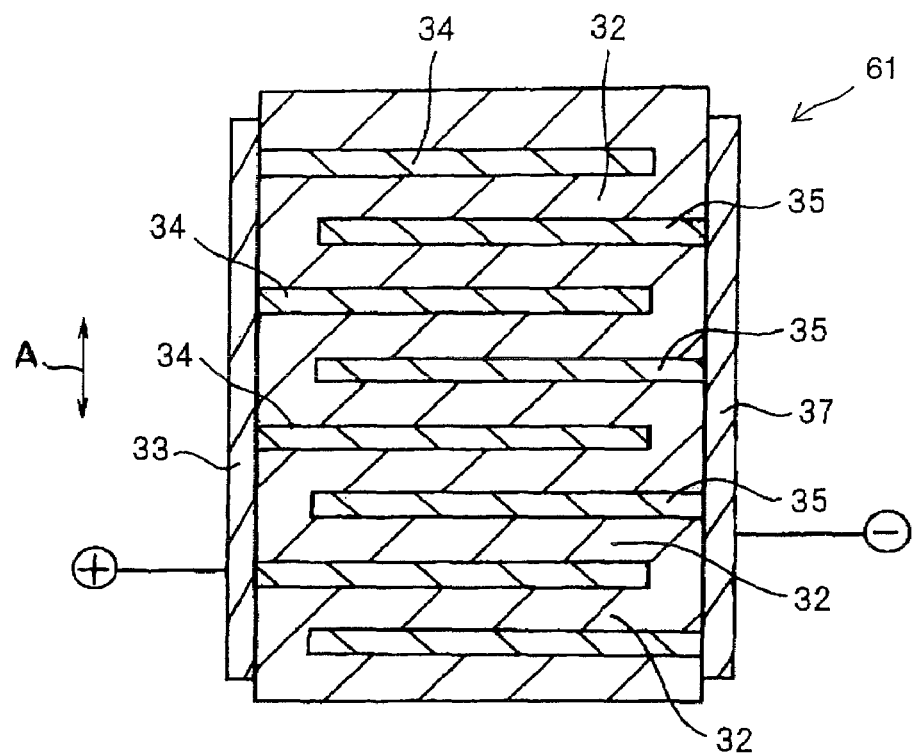
FIG. 6(a) is a vertical cross-sectional view of the piezoelectric/electrostrictive device shown in FIG. 5(a)
Figure 6B:
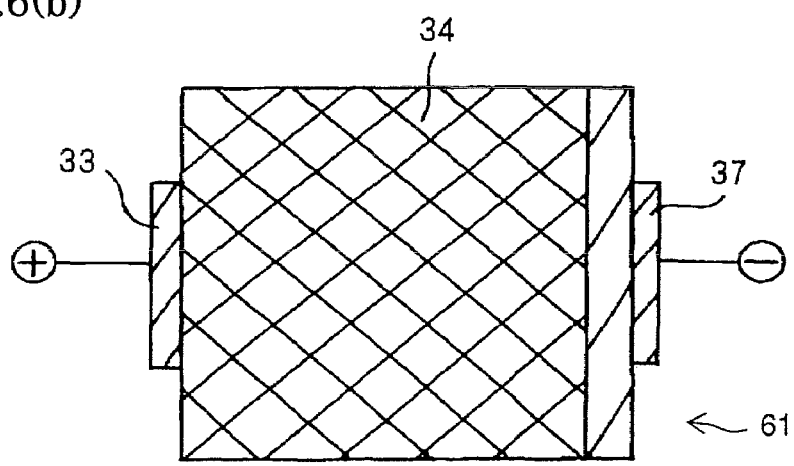
FIG. 6(b) is a horizontal cross-sectional view of the piezoelectric/electrostrictive device shown in FIG. 5(a).

FIGS. 5(a), 6(a), and 6(b) are views schematically showing yet another embodiment of the piezoelectric/electrostrictive device according to the present invention. FIG. 5(a) is a perspective view. FIG. 6(a) is a vertical cross-sectional view of FIG. 5(a), and FIG. 6(b) is a horizontal cross-sectional view of FIG. 5(a). FIG. 5(b) is a perspective view showing patterns of internal electrodes. A piezoelectric/electrostrictive device 61 according to this embodiment shown in FIGS. 5(a) to 6(b) includes two or more piezoelectric/electrostrictive portions (piezoelectric/electrostrictive portions 32) and two or more internal electrodes (internal electrodes 34 and 35). The piezoelectric/electrostrictive device 61 is a multilayer piezoelectric/electrostrictive device in which the piezoelectric/electrostrictive portions 32 are alternately sandwiched between the internal electrodes 34 and 35. The piezoelectric/electrostrictive device 61 differs from the piezoelectric/electrostrictive device 51 shown in FIG. 1 in that the piezoelectric/electrostrictive device 61 does not include a substrate to which the piezoelectric/electrostrictive portion and the internal electrode are solidly attached.

In the piezoelectric/electrostrictive device 61 according to this embodiment, a number of piezoelectric/electrostrictive layers 32 are stacked along a predetermined axis A, and the internal electrode layers 34 and 35 are alternately arranged between the adjacent piezoelectric/electrostrictive layers 32. A positive voltage is applied to the internal electrode layers 34, and a negative voltage is applied to the internal electrode layers 35. As shown in FIG. 5(b), the internal electrode layers 34 and 35 alternately arranged between the adjacent piezoelectric/electrostrictive layers 32 have different patterns (formed patterns). Therefore, the piezoelectric/electrostrictive device 61 according to this embodiment is also called an "offset multilayer piezoelectric/electrostrictive device". As shown in FIG. 6(a), the internal electrode layers 34 are electrically connected with an external electrode 33, and the internal electrode layers 35 are electrically connected with a different external electrode 37. That is, the external electrodes 33 and 37 are arranged to be respectively connected with the internal electrode layers 34 and 35.

4. Method of Producing Piezoelectric/Electrostrictive Device

A method of producing the piezoelectric/electrostrictive device according to the present invention is described below. First, a method of producing a piezoelectric/electrostrictive device having a substrate as the element will be described. An unfired piezoelectric/electrostrictive portion (layer) of a prescribed form is formed of the piezoelectric/electrostrictive ceramic composition on a ceramic substrate or on an internal electrode formed on a surface of the substrate. As examples of a method of forming the internal electrode, an ion beam method, sputtering method, vacuum deposition method, PVD method, ion plating method, CVD method, plating method, screen printing method, spraying method, dipping method, and the like can be given. The sputtering method and the screen printing method are particularly preferable from the viewpoint of bondability of the substrate and the piezoelectric/electrostrictive portion. The resulting internal electrode may be integrated with the substrate and/or the piezoelectric/electrostrictive portion by firing (heat treatment) at about 600° C. to 1400° C. The firing step may be performed each time an internal electrode is formed, or may be performed together with a heat treatment for the unfired piezoelectric/electrostrictive portion (layer).

In case of the first method of producing the piezoelectric/electrostrictive device according to the present invention, an unfired, and prescribed formed piezoelectric/electrostrictive portion (or layer) which is made of the above-mentioned piezoelectric/electrostrictive ceramic composition according to one of the embodiments of the present invention is formed on a ceramic substrate or an internal electrode formed on a ceramic substrate.

In case of the second method of producing the piezoelectric/electrostrictive device according to the present invention, an Ag electrode or an Ag—Pd electrode is used and an unfired, and prescribed formed piezoelectric/electrostrictive portion (or layer) which is made of a piezoelectric/electrostrictive ceramic composition comprising a $Pb(Mg_{1/3}Nb_{2/3})O_3$—$PbTiO_3$—$PbZrO_3$ ternary solid solution system composition as a major component, and Ni, and having an Ni content (in terms of NiO) of 0.05 to 3.0 mass % and having a prescribed form.

The $Pb(Mg_{1/3}Nb_{2/3})O_3$—$PbTiO_3$—$PbZrO_3$ ternary solid solution system composition for example, may be a PMN-PZT composition shown by the following formula (1),

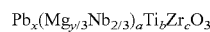  (1)

wherein $0.95 \leq x \leq 105$, $0.8 \leq y \leq 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in coordinate system having a, b, and c coordinate axes (provided that (a+b+c)=1.000).

As examples of the method of forming the unfired piezoelectric/electrostrictive portion (layer) on the substrate, an ion beam method, sputtering method, vacuum deposition method, PVD method, ion plating method, CVD method, plating method, sol-gel method, aerosol deposition method, screen printing method, spraying method, dipping method, and the like can be given. The screen printing method is particularly preferable since a highly accurate form and thickness can be obtained easily and continuously. In the case of forming the unfired piezoelectric/electrostrictive portion (layer) on the substrate by the screen printing method, it is preferable to add a specific amount of a Pb source such as Pb (PbO) to the piezoelectric paste as the material for forming the unfired piezoelectric/electrostrictive portion (layer), so that the piezoelectric/electrostrictive portion (layer) contains Pb. The amount of Pb to be added, in terms of PbO, is preferably 0.01 to 2.0 parts by mass, more preferably 0.1 to 1.5 parts by mass, and particularly preferably 0.5 to 1.0 part by mass based on 100 parts by mass of the PMN-PZT composition. By adjusting the amount of PbO in this range, the piezoelectric/electrostrictive characteristics of the piezoelectric/electrostrictive material (piezoelectric/electrostrictive portion) to be obtained are further improved. Next, an internal electrode is formed on the unfired piezoelectric/electrostrictive portion (layer) formed on the substrate by the same method described above. An unfired piezoelectric/electrostrictive portion (layer) and an internal electrode may be alternately and repeatedly formed on the internal electrode until a desired multilayer structure is obtained.

Then, the stacked body obtained by alternately stacking the unfired piezoelectric/electrostrictive portions (layers) and the internal electrodes on the surface of the substrate is integrally fired. This firing causes the piezoelectric/electrostrictive portion, which is formed of crystal grains of the piezoelectric/electrostrictive ceramic composition, to be solidly attached to the substrate directly or with the internal electrode placed therebetween. The firing need not necessarily be performed all at once. The firing step may be performed each time the unfired piezoelectric/electrostrictive portion (layer) is formed. However, it is preferable to integrally fire the piezoelectric/electrostrictive portion (layer) together with the internal electrodes from the viewpoint of production efficiency.

In case of the second method of producing the piezoelectric/electrostrictive device according to the present invention, an unfired, and prescribed formed piezoelectric/electrostrictive portion is fired with contacting the portion to an Ag electrode or an Ag—Pd electrode. By doing so, a part of Ag is immigrated into piezoelectric/electrostrictive portion, thereby piezoelectric/electrostrictive portion containing a desired level of Ag can be obtained. The content of Ag in the piezoelectric/electrostrictive portion as a result of the immigration during firing may be regulated by choosing properly firing temperature, the grain size distribution of Ag grains or Ag—Pd grains contained in the internal electrode, the amount of Pb to be added to the unfired piezoelectric/electrostrictive portion, firing atmosphere and the like. In the case that an Ag—Pd electrode is used as an internal electrode, the amount of Ag to be immigrated into the portion may be controlled by adjusting the Ag/Pd ratio contained in the Ag—Pd electrode.

The firing temperature is 950° C. or higher but lower than 1100° C., preferably 975 to 1050° C., and particularly preferably 1000 to 1050° C. If the firing temperature is lower than 950° C., the substrate or the internal electrode may not be solidly attached to the piezoelectric/electrostrictive portion sufficiently, or the density of the piezoelectric/electrostrictive portion may be insufficient. If the firing temperature exceeds 1100° C., it may be difficult to employ an Ag electrode or an Ag—Pd electrode having a relatively low heat resistant temperature as the internal electrode. The maximum temperature retention time during the firing is preferably 1 minute to 10 hours, and more preferably 5 minutes to 4 hours. If the maximum temperature retention time is less than 1 minute, densification of the piezoelectric/electrostrictive portion tends to be inadequate, whereby desired characteristics may not be obtained. If the maximum temperature retention time exceeds 10 hours, the total volatilization amount of Pb and Ni increases even if the atmosphere is controlled, whereby the piezoelectric/electrostrictive characteristics may decrease or occurrence of a dielectric breakdown may increase.

Then, a polarization treatment is performed under suitable conditions. It is preferable to perform the polarization treatment with heating according to a known method. The heating temperature varies depending on the Curie point of the piezoelectric/electrostrictive ceramic, but is preferably 40 to 200° C.

A plasticizer, a dispersant, a solvent, and the like may be added to the piezoelectric/electrostrictive ceramic composition, and the components may be mixed using a general mixing device such as a ball mill to form a slurry. Then, the slurry may be formed into a sheet using a general sheet forming apparatus such as a doctor blade to obtain a sheet-formed unfired piezoelectric/electrostrictive portion (green sheet). The unfired piezoelectric/electrostrictive portion (layer) may also be formed on the substrate using the obtained green sheet instead of forming the unfired piezoelectric/electrostrictive portion (layer) by the screen printing method. When forming the green sheet, it is preferable to add a specific amount of a Pb source such as PbO.

The amount of Pb to be added to the unfired piezoelectric/electrostrictive portion, in terms of PbO, is preferably 0.01 to 2.0 parts by mass, more preferably 0.1 to 1.5 parts by mass, and particularly preferably 0.5 to 1.0 part by mass based on 100 parts by mass of the PMN-PZT composition. By adjusting the added amount of PbO in this range, the piezoelectric/electrostrictive characteristics of the resulting piezoelectric/electrostrictive material (piezoelectric/electrostrictive portion) to be obtained are further improved.

A green stacked body with a specific thickness can be obtained by forming a conductive film (film having a conductive material as the major component) in a specific pattern as the internal electrode on the surface of the green sheet to obtain a green sheet with internal electrode, and stacking and compression-bonding the green sheets with an internal electrode, for example.

A green stacked body having a cell structure with specific cells can be obtained by stacking and compression-bonding the green sheets with an internal electrode subjected to a punch-out process by a punch and a die, for example.

A fired stacked body (i.e. a piezoelectric/electrostrictive device) can be obtained by integrally firing the obtained green stacked body. By firing the green stacked body having a cell structure, a cell-driven piezoelectric/electrostrictive device can be obtained. The firing step need not necessarily be performed all at once. The firing step may be performed each time the unfired ceramic composition layer is formed. However, it is preferable to integrally fire the piezoelectric/electrostrictive portion (layer) together with the internal electrodes from the viewpoint of production efficiency.

Next, a method of producing a piezoelectric/electrostrictive device which does not have a substrate as the essential element, represented by the embodiment shown in FIGS. 5(a) to 6(b), will be described. First, the sheet-formed unfired piezoelectric/electrostrictive portion (green sheet) is subjected to a punch-out process using a punch and a die to form a positioning hole or the like. Then, an electrode paste is applied to the surface of the green sheet by a screen printing method or the like to obtain a green sheet with an internal electrode. The green sheets with an internal electrode are stacked, the formed positioning hole (punch hole) being the stacking axis, and compression-bonded at a specific pressure with heating as necessary. Thus, a green stacked body is obtained. The obtained green stacked body is fired and formed into a desired form, if necessary. Then, external electrodes are arranged to be respectively connected with the internal electrodes to produce an offset stacked piezoelectric/electrostrictive device (piezoelectric/electrostrictive device 61) as shown in FIGS. 5(a) to 6(b) are produced.

EXAMPLES

The present invention is described below in detail by way of examples. Note that the present invention is not limited to the following examples. Methods for measuring and evaluating various characteristics were as follows.

[Ni content and Ag content] The Ni content and the Ag content of a standard substance were measured using the ICP method or the XRF method to create calibration curves. Then, a sample was subjected to measurement by the EPMA method to calculate the NiO content and the Ag content based on the created calibration curves.

[Dielectric breakdown electric field] A voltage (0.5 pulses) corresponding to a peak electric field of 25 kV/mm was applied to the piezoelectric device in a triangular wave pattern. The dielectric breakdown electric field (kV/mm) was calculated from changes in the values of electric current and voltage.

[Effective strain rate] The displacement of each piezoelectric/electrostrictive device was measured using a laser Doppler displacement meter by applying a specific electric field. The thickness of the piezoelectric/electrostrictive portion was measured by observing the dimensions of the cross section. The effective strain rate (ppm) of the piezoelectric/electrostrictive device was calculated from the measurement results.

Example 1

PbO, $ZrO_2$, $TiO_2$, MgO, $Nb_2O_5$, and NiO were weighed and mixed so that the metal elements were contained at a ratio (molar ratio) expressed by the compositional formula "Pb $(Mg_{1/3}Nb_{2/3})O_3$—$PbTiO_3$—$PbZrO_3$". NiO was further added and mixed to adjust the NiO content to 0.05 mass % to obtain a mixed raw material. The obtained mixed raw material was subjected to heat treatment at 950° C., and AgO was added so that the Ag content (in terms of AgO) in the piezoelectric/electrostrictive device was 0.01 mass %. After the addition of a binder and a solvent, the components were mixed using a triple roll mill to obtain a paste. The obtained paste was applied to and patterned on a zirconia substrate (thickness of thin portion: 5 μm), which had a film-formed Ag—Pd lower electrode (thickness: 3 μm, Ag:Pd (mass ratio)=7:3), by a screen printing method to a thickness of 13 μm. After firing the resulting product at 1050° C., Ag electrode paste was applied and patterned by a screen printing method. Then, a film-formed Ag upper electrode (thickness: 3 μm) was formed by firing at 600° C. to obtain a single-layer piezoelectric/electrostrictive device. The evaluation results of the piezoelectric/electrostrictive device are shown in Table 1.

Examples 2 to 12 and Comparative Examples 1 to 4

A single-layer piezoelectric/electrostrictive device was obtained in the same manner as in Example 1 except that the amounts of NiO and AgO were adjusted so that the Ni content (in terms of NiO) and the Ag content (in terms of AgO) were contained as shown in Table 1. The evaluation results of the piezoelectric/electrostrictive device are shown in Table 1.

TABLE 1

| | NiO (mass %) | AgO (mass %) | Firing temperature (° C.) | Dielectric breakdown electric field (kV/mm) | Effective strain rate (ppm) |
|---|---|---|---|---|---|
| Example 1 | 0.05 | 0.01 | 1050 | 12.5 | 1210 |
| Example 2 | 0.05 | 0.5 | 1050 | 12.7 | 1310 |
| Example 3 | 0.05 | 1 | 1050 | 12.7 | 1170 |
| Example 4 | 0.2 | 0.01 | 1050 | 12 | 1390 |
| Example 5 | 0.2 | 0.5 | 1050 | 12.2 | 1380 |
| Example 6 | 0.2 | 1 | 1050 | 12.5 | 1190 |
| Example 7 | 1.5 | 0.01 | 1050 | 11.8 | 1410 |
| Example 8 | 1.5 | 0.5 | 1050 | 12.3 | 1400 |
| Example 9 | 1.5 | 1 | 1050 | 12 | 1200 |
| Example 10 | 3 | 0.01 | 1050 | 11.5 | 1320 |
| Example 11 | 3 | 0.5 | 1050 | 12.3 | 1300 |
| Example 12 | 3 | 1 | 1050 | 12.5 | 1230 |
| Comparative Example 1 | 0 | 0.01 | 1050 | 9 | 950 |
| Comparative Example 2 | 0 | 1 | 1050 | 10.5 | 920 |
| Comparative Example 3 | 0.05 | 0 | 1050 | 6.5 | 970 |
| Comparative Example 4 | 3 | 0 | 1050 | 6.3 | 1050 |

Example 13

PbO, $ZrO_2$, $TiO_2$, MgO, $Nb_2O_5$, and NiO were weighed and mixed so that the metal elements were contained at a ratio (molar ratio) expressed by the compositional formula "Pb $(Mg_{1/3}Nb_{2/3})O_3$—$PbTiO_3$—$PbZrO_3$". NiO was further added and mixed to adjust the NiO content to 0.05 mass % with the composition to obtain a mixed raw material. The mixed raw material was subjected to a heat treatment at 950° C., and AgO was added so that the Ag content (in terms of AgO) in the piezoelectric/electrostrictive device was 0.01 mass %. After the addition of a binder and a solvent, the components were mixed using a triple roll mill to obtain a paste. A green sheet (thickness: 100 µm) was prepared from the resulting paste using a doctor blade. The paste was then applied as an adhesive to the resulting green sheet by a screen printing method, and a pattern such as a number of positioning holes was punched out by die processing. Then, an Ag—Pd electrode paste was applied to and patterned on the green sheet by a screen printing method to obtain a green sheet with an electrode. A green stacked body was obtained by stacking 100 green sheets with an electrode and 30 green sheets without an electrode (10 upper layers and 20 lower layers), with the punch holes as the stacking axes, and compression-bonding the green sheets at a pressure of 200×103 N (Newton) while heating the green sheets at 80° C. After removing the binder from the green stacked body by heating it at 600° C., and the resulting green stacked body was fired at 1050° C., and formed in the form of a pillar by slicing. External electrodes respectively connected with every other electrode were formed to obtain a multilayer piezoelectric/electrostrictive device. The evaluation results of the piezoelectric/electrostrictive device are shown in Table 2.

Examples 14 to 24 and Comparative Examples 5 to 8

A multilayer piezoelectric/electrostrictive device was obtained in the same manner as in Example 13 except that the amounts of NiO and AgO were adjusted so that the Ni content (in terms of NiO) and the Ag content (in terms of AgO) were contained as shown in Table 2. The evaluation results of the piezoelectric/electrostrictive device are shown in Table 2.

TABLE 2

|  | NiO (mass %) | AgO (mass %) | Firing temperature (° C.) | Dielectric breakdown electric field (kV/mm) | Effective strain rate (ppm) |
|---|---|---|---|---|---|
| Example 13 | 0.05 | 0.01 | 1050 | 6.25 | 1200 |
| Example 14 | 0.05 | 0.5 | 1050 | 6.35 | 1310 |
| Example 15 | 0.05 | 1 | 1050 | 6.35 | 1160 |
| Example 16 | 0.2 | 0.01 | 1050 | 6 | 1200 |
| Example 17 | 0.2 | 0.5 | 1050 | 6.1 | 1390 |
| Example 18 | 0.2 | 1 | 1050 | 6.25 | 1180 |
| Example 19 | 1.5 | 0.01 | 1050 | 5.9 | 1400 |
| Example 20 | 1.5 | 0.5 | 1050 | 6.15 | 1400 |
| Example 21 | 1.5 | 1 | 1050 | 6 | 1190 |
| Example 22 | 3 | 0.01 | 1050 | 5.75 | 1310 |
| Example 23 | 3 | 0.5 | 1050 | 6.15 | 1300 |
| Example 24 | 3 | 1 | 1050 | 6.25 | 1240 |
| Comparative Example 5 | 0 | 0.01 | 1050 | 4.6 | 950 |
| Comparative Example 6 | 0 | 1 | 1050 | 4.5 | 920 |
| Comparative Example 7 | 0.05 | 0 | 1050 | 4.2 | 960 |
| Comparative Example 8 | 3 | 0 | 1050 | 4.3 | 1030 |

Examples 25 to 36

A single-layer piezoelectric/electrostrictive device was obtained in the same manner as in Example 1, except that PbO, ZrO$_2$, TiO$_2$, MgO, Nb$_2$O$_5$, and NiO were weighed and mixed so that the metal elements were contained at a ratio (molar ratio) expressed by the compositional formula "Pb$_x$(Mg$_{y/3}$Nb$_{2/3}$)$_a$Ti$_b$Zr$_c$O$_3$" to obtain a mixed raw material (x, y, a, b, and c in the compositional formula are the values shown in Table 3), and the amounts of NiO and AgO were adjusted so that the Ni content (in terms of NiO) and the Ag content (in terms of AgO) were contained as shown in Table 3. The evaluation results of the piezoelectric/electrostrictive device are shown in Table 3,

TABLE 3

|  | x | y | a | b | c | NiO (mass %) | Ag (mass %) | Firing temperature (° C.) | Dielectric breakdown electric field (kV/mm) | Effective strain rate (ppm) |
|---|---|---|---|---|---|---|---|---|---|---|
| Example 25 | 0.9 | 0.85 | 0.2 | 0.43 | 0.37 | 0.2 | 0.3 | 1050 | 9.2 | 1170 |
| Example 26 | 0.9 | 0.9 | 0.2 | 0.43 | 0.37 | 0.2 | 0.3 | 1050 | 9.3 | 1240 |
| Example 27 | 0.9 | 1.1 | 0.2 | 0.43 | 0.37 | 0.2 | 0.3 | 1050 | 9.5 | 1050 |
| Example 28 | 0.97 | 0.85 | 0.2 | 0.43 | 0.37 | 0.2 | 0.3 | 1050 | 9.3 | 1290 |
| Example 29 | 0.95 | 1.1 | 0.2 | 0.43 | 0.37 | 0.2 | 0.3 | 1050 | 11.7 | 1390 |
| Example 30 | 0.97 | 0.9 | 0.2 | 0.43 | 0.37 | 0.2 | 0.3 | 1050 | 12.2 | 1370 |
| Example 31 | 1 | 1 | 0.2 | 0.43 | 0.37 | 0.2 | 0.3 | 1050 | 13.2 | 1380 |
| Example 32 | 1.05 | 0.85 | 0.2 | 0.43 | 0.37 | 0.2 | 0.3 | 1050 | 13.4 | 1360 |
| Example 33 | 0.97 | 1.1 | 0.2 | 0.43 | 0.37 | 0.2 | 0.3 | 1050 | 9 | 1180 |
| Example 34 | 1.1 | 0.85 | 0.2 | 0.43 | 0.37 | 0.2 | 0.3 | 1050 | 10.5 | 1160 |
| Example 35 | 1.1 | 0.9 | 0.2 | 0.43 | 0.37 | 0.2 | 0.3 | 1050 | 11.2 | 1140 |
| Example 36 | 1.1 | 1.1 | 0.2 | 0.43 | 0.37 | 0.2 | 0.3 | 1050 | 10.2 | 1050 |

Examples 37 to 56

A single-layer piezoelectric/electrostrictive device was obtained in the same manner as in Example 1, except that PbO, ZrO$_2$, TiO$_2$, MgO, Nb$_2$O$_5$, and NiO were weighed and mixed so that the metal elements were contained at a ratio (molar ratio) expressed by "Pb$_x$(Mg$_{y/3}$Nb$_{2/3}$)$_a$Ti$_b$Zr$_c$O$_3$" to obtain a mixed raw material (x, y, a, b, and c in the compositional formula are the values shown in Table 4) and the amounts of NiO and AgO were adjusted so that the Ni content (in terms of NiO) and the Ag content (in terms of AgO) were contained as shown in Table 4 The evaluation results of the piezoelectric/electrostrictive device are shown in Table 4.

TABLE 4

|  | x | y | a | b | c | NiO (mass %) | AgO (mass %) | Firing temperature (° C.) | Dielectric breakdown electric field (kV/mm) | Effective strain rate (ppm) |
|---|---|---|---|---|---|---|---|---|---|---|
| Example 37 | 1 | 1 | 10 | 42.5 | 47.5 | 0.2 | 0.3 | 1050 | 12.8 | 1360 |
| Example 38 | 1 | 1 | 10 | 52.5 | 37.5 | 0.2 | 0.3 | 1050 | 12.6 | 1370 |
| Example 39 | 1 | 1 | 37.5 | 32.5 | 30 | 0.2 | 0.3 | 1050 | 12.5 | 1390 |
| Example 40 | 1 | 1 | 37.5 | 42.5 | 20 | 0.2 | 0.3 | 1050 | 12.4 | 1400 |
| Example 41 | 1 | 1 | 55 | 42.5 | 2.5 | 0.2 | 0.3 | 1050 | 12.3 | 1380 |
| Example 42 | 1 | 1 | 55 | 32.5 | 12.5 | 0.2 | 0.3 | 1050 | 12.5 | 1360 |
| Example 43 | 1 | 1 | 12 | 50 | 38 | 0.2 | 0.3 | 1050 | 12.5 | 1360 |
| Example 44 | 1 | 1 | 15 | 43 | 42 | 0.2 | 0.3 | 1050 | 12.7 | 1380 |
| Example 31 | 1 | 1 | 20 | 43 | 37 | 0.2 | 0.3 | 1050 | 13.2 | 1380 |
| Example 45 | 1 | 1 | 30 | 36.5 | 33.5 | 0.2 | 0.3 | 1050 | 12.9 | 1390 |
| Example 46 | 1 | 1 | 36 | 40 | 24 | 0.2 | 0.3 | 1050 | 12.6 | 1390 |
| Example 47 | 1 | 1 | 46 | 38 | 16 | 0.2 | 0.3 | 1050 | 12.3 | 1380 |
| Example 48 | 1 | 1 | 50 | 35 | 15 | 0.2 | 0.3 | 1050 | 12.5 | 1390 |
| Example 49 | 1 | 1 | 5 | 47 | 48 | 0.2 | 0.3 | 1050 | 10.2 | 1160 |
| Example 50 | 1 | 1 | 10 | 35 | 55 | 0.2 | 0.3 | 1050 | 10.3 | 1180 |
| Example 51 | 1 | 1 | 10 | 57 | 33 | 0.2 | 0.3 | 1050 | 10.4 | 1200 |
| Example 52 | 1 | 1 | 25 | 32.5 | 42.5 | 0.2 | 0.3 | 1050 | 10.3 | 1190 |
| Example 53 | 1 | 1 | 30 | 53 | 17 | 0.2 | 0.3 | 1050 | 9.5 | 1180 |
| Example 54 | 1 | 1 | 47 | 48 | 5 | 0.2 | 0.3 | 1050 | 9.4 | 1190 |
| Example 55 | 1 | 1 | 50 | 30 | 20 | 0.2 | 0.3 | 1050 | 9.7 | 1170 |
| Example 56 | 1 | 1 | 60 | 33 | 7 | 0.2 | 0.3 | 1050 | 9 | 1180 |

Examples 57 to 60

A single-layer piezoelectric/electrostrictive device was obtained in the same manner as in Example 5 except that the firing temperature was as shown in Table 5. A Pt electrode was used in Example 60. The evaluation results of the piezoelectric/electrostrictive device are shown in Table 5.

TABLE 5

|  | NiO (mass %) | AgO (mass %) | Firing temperature (° C.) | Dielectric breakdown electric field (kV/mm) | Effective strain rate (ppm) |
|---|---|---|---|---|---|
| Example 57 | 0.2 | 0.5 | 950 | 12.9 | 1200 |
| Example 58 | 0.2 | 0.5 | 1000 | 13.5 | 1380 |
| Example 59 | 0.2 | 0.5 | 1100 | 11.9 | 1400 |
| Example 60 | 0.2 | 0.5 | 1150 | 9.3 | 1240 |

Examples 61 and 62

A multilayer piezoelectric/electrostrictive device was obtained in the same manner as in Example 17 except that 200 or 400 green sheets with an electrode were stacked. The evaluation results of the piezoelectric/electrostrictive device are shown in Table 6.

TABLE 6

|  | No. of layers | NiO (mass %) | AgO (mass %) | Firing temperature (° C.) | Dielectric breakdown electric field (kV/mm) | Effective strain rate (ppm) |
|---|---|---|---|---|---|---|
| Example 17 | 100 | 0.2 | 0.5 | 1050 | 6.1 | 1390 |
| Example 61 | 200 | 0.2 | 0.5 | 1050 | 6.24 | 1390 |
| Example 62 | 400 | 0.2 | 0.5 | 1050 | 6.2 | 1410 |

Examples 63 to 66

A multilayer piezoelectric/electrostrictive device was obtained in the same manner as in Example 17 except that PbO was added in an amount shown in Table 7 when preparing (forming) the green sheet. The evaluation results of the piezoelectric/electrostrictive device are shown in Table 7.

TABLE 7

|  | NiO (mass %) | AgO (mass %) | PbO (mass %) | Firing temperature (° C.) | Dielectric breakdown electric field (kV/mm) | Effective strain rate (ppm) |
|---|---|---|---|---|---|---|
| Example 17 | 0.2 | 0.5 | 0 | 1050 | 6.1 | 1390 |
| Example 63 | 0.2 | 0.5 | 0.5 | 1050 | 6.65 | 1430 |
| Example 64 | 0.2 | 0.5 | 1 | 1050 | 6.62 | 1450 |
| Example 65 | 0.2 | 0.5 | 2 | 1050 | 6.67 | 1440 |
| Example 66 | 0.2 | 0.5 | 3 | 1050 | 6.64 | 1130 |

What is claimed is:

1. A piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni, in terms of NiO, and 0.01 to 1.0 mass % of Ag, in terms of AgO.

2. The piezoelectric/electrostrictive ceramic composition according to claim 1, wherein the $Pb(Mg_{1/3}Nb_{2/3})O_3$—$PbTiO_3$—$PbZrO_3$ ternary solid solution system composition is shown by the following formula (1), $$Pb_x(Mg_{y/3}Nb_{2/3})_aTi_bZr_cO_3 \qquad (1)$$

wherein $0.95 \leq x \leq 1.05$, $0.8 \leq y \leq 1.0$, and a, b, and c are decimal fractions in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), and (0.375, 0.425, 0.200) in coordinate system having a, b, and c coordinate axes (provided that (a+b+c)=1.000).

3. A piezoelectric/electrostrictive device comprising:
a piezoelectric/electrostrictive portion formed of a piezoelectric/electrostrictive ceramic composition comprising a $Pb(Mg_{1/3}Nb_{2/3})O_3$—$PbTiO_3$—$PbZrO_3$ ternary solid solution system composition as a major component, and further contains 0.05 to 3.0 mass % of Ni, in terms of NiO, and 0.01 to 1.0 mass % of Ag, in terms of AgO; and
an internal electrode electrically connected with the piezoelectric/electro-strictive portion.

4. The piezoelectric/electrostrictive device according to claim 3:
wherein the $Pb(Mg_{1/3}Nb_{2/3})O_3$—$PbTiO_3$—$PbZrO_3$ ternary solid solution system composition is shown by the following formula (1), $$Pb_x(Mg_{y/3}Nb_{2/3})_aTi_bZr_cO_3 \qquad (1)$$

wherein $0.95 \leq x \leq 1.05$, $0.8 \leq y \leq 1.0$ and a, b, and c are decimal fractions in a range surrounded with (a, b, c) (0.550, 0.425, 0.025), (0.550, 0.325, 0.125), (0.375, 0.325, 0.300), (0.100, 0.425, 0475), (0.100, 0.525, 0.375), and (0.375, 0.425, 0.200) in coordinate system having a, b, and c coordinate axes (provided that (a+b+c)=1.000).

5. The piezoelectric/electrostrictive device according to claim 3, further comprising:
a substrate formed of a ceramic;
wherein the piezoelectric/electrostrictive portion is solidly attached on the substrate directly or with the internal electrode placed therebetween.

6. The piezoelectric/electrostrictive device according to claim 5, comprising:
a plurality of the piezoelectric/electrostrictive portions and a plurality of the internal electrodes;
wherein the piezoelectric/electrostrictive portions are stacked alternately by sandwiching a single or plural number of piezoelectric/electrostrictive portions between the internal electrodes.

7. The piezoelectric/electrostrictive device according to claim 6, wherein the internal electrode is an Ag electrode or an Ag—Pd electrode.

8. The piezoelectric/electrostrictive device according to claim 7, further comprising an external electrode connected with every other internal electrode.

9. The piezoelectric/electrostrictive device according to claim 3, comprising:
a plurality of the piezoelectric/electrostrictive portions and a plurality of the internal electrodes;
wherein the piezoelectric/electrostrictive portions are stacked alternately by sandwiching a single or plural number of piezoelectric/electrostrictive portions between the internal electrodes.

10. The piezoelectric/electrostrictive device according to claim 9, wherein the internal electrode is an Ag electrode or an Ag—Pd electrode.

11. The piezoelectric/electrostrictive device according to claim 10, further comprising an external electrode connected with every other internal electrode.

12. The piezoelectric/electrostrictive device according to claim 3, wherein the internal electrode is an Ag electrode or an Ag—Pd electrode.

13. The piezoelectric/electrostrictive device according to claim 12, further comprising an external electrode connected with every other internal electrode.

* * * * *

UNITED STATES PATENT AND TRADEMARK OFFICE
CERTIFICATE OF CORRECTION

PATENT NO. : 7,545,084 B2  Page 1 of 1
APPLICATION NO. : 11/778837
DATED : June 9, 2009
INVENTOR(S) : Tsutomu Nanataki, Nobuyuki Kobayashi and Koichi Yoshino It is certified that error appears in the above-identified patent and that said Letters Patent is hereby corrected as shown below:

Column 19
    *Line 13*: add -- . -- after "Table 4"

Column 21
    *Line 32*: change "electric/electro-strictive" to --electric/electrostrictive--
    *Line 40*: add -- = -- after "(a, b, c)"

Signed and Sealed this

Eighteenth Day of August, 2009

David J. Kappos
*Director of the United States Patent and Trademark Office*